(12) United States Patent
Hoentschel et al.

(10) Patent No.: US 7,344,984 B2
(45) Date of Patent: Mar. 18, 2008

(54) TECHNIQUE FOR ENHANCING STRESS TRANSFER INTO CHANNEL REGIONS OF NMOS AND PMOS TRANSISTORS

(75) Inventors: Jan Hoentschel, Neustadt in Sachsen (DE); Andy Wei, Dresden (DE); Markus Lenski, Dresden (DE); Peter Javorka, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 48 days.

(21) Appl. No.: 11/468,450

(22) Filed: Aug. 30, 2006

(65) Prior Publication Data

US 2007/0122966 A1 May 31, 2007

(30) Foreign Application Priority Data

Nov. 30, 2005 (DE) ...................... 10 2005 057 073

(51) Int. Cl.
*H01L 21/44* (2006.01)
*H01L 21/4763* (2006.01)

(52) U.S. Cl. ...................... 438/682; 438/197; 438/597; 438/649; 438/664; 257/734; 257/E21.64; 257/E21.634; 257/E21.438; 257/E21.636

(58) Field of Classification Search ................ 438/197, 438/597, 649, 664, 682; 257/734, E21.64, 257/E21.634, E21.438, E21.636
See application file for complete search history.

(56) References Cited

U.S. PATENT DOCUMENTS

| | | | |
|---|---|---|---|
| 6,512,273 B1 | 1/2003 | Krivokapic et al. | 257/369 |
| 7,122,410 B2* | 10/2006 | Kammler et al. | 438/154 |
| 2004/0113217 A1 | 6/2004 | Chidambarrao et al. | 257/415 |
| 2005/0035470 A1 | 2/2005 | Ko et al. | 257/900 |
| 2005/0156208 A1 | 7/2005 | Lin et al. | 257/288 |
| 2005/0214998 A1 | 9/2005 | Chen et al. | 438/199 |
| 2005/0260810 A1 | 11/2005 | Cheng et al. | 438/199 |
| 2006/0038229 A1* | 2/2006 | Tsuchiya et al. | 257/351 |
| 2007/0040225 A1* | 2/2007 | Yang | 257/369 |

* cited by examiner

*Primary Examiner*—Michael Lebentritt
*Assistant Examiner*—Mohsen Ahmadi
(74) *Attorney, Agent, or Firm*—Williams, Morgan & Amerson, P.C.

(57) ABSTRACT

A method and a semiconductor device are provided in which respective contact layers having a specific intrinsic stress may be directly formed on respective metal silicide regions without undue metal silicide degradation during an etch process for removing an unwanted portion of an initially deposited contact layer. Moreover, due to the inventive concept, the strain-inducing contact layers may be formed directly on the respective substantially L-shaped spacer elements, thereby enhancing even more the stress transfer mechanism.

21 Claims, 8 Drawing Sheets

TECHNIQUE FOR ENHANCING STRESS TRANSFER INTO CHANNEL REGIONS OF NMOS AND PMOS TRANSISTORS

BACKGROUND OF THE INVENTION

1. Field of the Invention

Generally, the present invention relates to the formation of integrated circuits, and, more particularly, to the formation of different transistor types having strained channel regions by using stress-inducing sources, such as contact layers having tensile and compressive stress, respectively, embedded strain layers and the like, to enhance charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently one of the most promising approaches, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed close to the channel region and separated therefrom by a thin insulating layer. The conductivity of the channel region, upon formation of a conductive channel, due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions in order to provide low sheet and contact resistivity in combination with a desired channel controllability. In addition, the vertical location of the PN junctions with respect to the gate insulation layer also represents a critical design criterion in view of leakage current control. Hence, reducing the channel length may also require reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Since the continuous size reduction of the critical dimensions, i.e., the gate length of the transistors, necessitates the adaptation and possibly the new development of highly complex process techniques concerning the above-identified process steps, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the above process adaptations associated with device scaling. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region increases the mobility of electrons, wherein, depending on the magnitude and direction of the tensile strain, an increase in mobility of 50% or more may be obtained, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium layer or a silicon/carbon layer in or below the channel region to create tensile or compressive stress that may result in a corresponding strain. Although the transistor performance may be considerably enhanced by the introduction of stress-creating layers in or below the channel region, significant efforts have to be made to implement the formation of corresponding stress layers into the conventional and well-approved MOS technique. For instance, additional epitaxial growth techniques have to be developed and implemented into the process flow for forming the germanium or carbon-containing stress layers at appropriate locations in or below the channel region. Hence, process complexity is significantly increased, thereby also increasing production costs and the potential for a reduction in production yield.

Thus, in other approaches, external stress created by, for instance, overlaying layers, spacer elements and the like is used in an attempt to create a desired strain within the channel region. Although a promising approach, the process of creating the strain in the channel region by applying a specified external stress may depend on the efficiency of the stress transfer mechanism for the external stress provided by, for instance, contact layers, spacers and the like into the channel region to create the desired strain therein. Hence, although providing significant advantages over the above-discussed approach requiring additional stress layers within the channel region, the efficiency of the stress transfer mechanism may depend on the process and device specifics and may result in a reduced performance gain for one type of transistors.

In another approach, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source regions of the PMOS transistors are selectively recessed, while the NMOS transistors are masked, and, subsequently, the silicon/germanium layer is selectively formed in the PMOS transistor by epitaxial growth. Although this technique offers significant advantages in view of performance gain of the PMOS transistor and thus of the entire CMOS device, an appropriate design may have to be used that balances the difference in performance gain of the PMOS transistor and the NMOS transistor.

In view of the above-described situation, there exists a need for an improved technique that enables efficiently increasing performance of PMOS transistors and NMOS transistors, while substantially avoiding or at least reducing one or more of the above-identified problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of different types of transistors, such as P-channel transistors and N-channel transistors, wherein each type of transistor receives a contact layer formed thereon which has a specific inherent stress for enhancing the performance of each transistor type. For this purpose, the process of forming a metal silicide is performed separately for each type of transistor, thereby providing enhanced flexibility in forming the respectively stressed contact layers, wherein, in some illustrative embodiments, the respective contact layer may be directly formed on the respective metal silicide regions.

In an illustrative embodiment of the present invention, the method comprises forming a first metal silicide in a gate electrode and drain and source regions of a first transistor while covering a second transistor with a first silicidation mask. The method further comprises forming a second metal silicide in a gate electrode and drain and source regions of a second transistor, while covering the first transistor having the first metal silicide with a second silicidation mask. Additionally, a first contact layer having a first type of intrinsic stress is selectively formed above the first transistor and a second contact layer having a second type of intrinsic stress is selectively formed above the second transistor.

According to another illustrative embodiment of the present invention, a semiconductor device comprises a first transistor and a second transistor. The first transistor comprises a first gate electrode and first drain and source regions and a first conformal liner formed at sidewalls of the first gate electrode and on a portion of the first drain and source regions. The first gate electrode and the first drain and source regions have formed therein first metal silicide regions. Similarly, the second transistor comprises a second gate electrode and second drain and source regions and a second conformal liner formed at the sidewalls of the second gate electrode and on a portion of the second drain and source regions, wherein the second gate electrode and the second drain and source regions have formed therein second metal silicide regions. Furthermore, the semiconductor device comprises a first contact layer formed above the first metal silicide regions and having a first type of stress and further comprises a second contact layer formed above the second metal silicide regions and having a second type of stress other than the first type. Moreover, the semiconductor device comprises an interlayer dielectric layer formed on the first and second contact layers.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention contemplates a technique for manufacturing transistor elements of different types of conductivity, such as NMOS transistors and PMOS transistors, wherein it should be understood that the term NMOS is to be considered as a generic notion for any type of N-channel field effect transistor and similarly the term PMOS is to be considered as a generic notion for any type of P-channel field effect transistor. For the different types of transistors, the charge carrier mobility of holes and electrons in the respective transistor types is enhanced by providing, possibly in combination with other strain-inducing mechanisms, a stressed contact layer or contact etch stop layer above the respective transistor so as to induce a respective strain in the corresponding channel region of the respective transistors. Thus, for a P-channel transistor, a compressively strained contact layer may be formed in close proximity to the transistor, while a contact layer including tensile stress may be formed in close proximity to the N-channel transistor, wherein, in some illustrative embodiments, the respective contact layers are formed directly on the respective transistors, i.e., directly on metal silicide regions to be formed in drain and source regions as well as the gate electrodes of the respective transistors. In this respect, the term "contact layer" is to be understood as a portion of an interlayer dielectric material, which is formed to enclose and passivate the respective transistor elements and through which corresponding contact plugs are formed to directly connect to respective contact regions, such as the gate electrode and the drain and source regions of the transistor elements. The contact layer may represent a portion of the interlayer dielectric material, which may also be used, in some illustrative embodiments, as an etch stop layer during the formation of respective contact openings through an overlying portion of the respective interlayer dielectric material.

According to the principles of the present invention, a semiconductor device and a method for forming the same are provided in which the formation of the respective contact layers may be accomplished in such a way that, for both types of transistors, the contact layer may be provided in close proximity to, or even directly on, the respective transistor elements without unduly affecting the respective metal silicides that are formed in and on the corresponding transistor areas. For this purpose, the silicidation process for each of the transistors may be performed separately, wherein intermittently a first contact layer or a portion thereof may be formed, which may then be selectively removed from one of the transistors that has not yet received the respective metal silicide. In addition, additional stress sources for inducing an appropriate strain in the respective channel regions may be provided in combination with the highly efficient formation of the contact layers such that, for instance, in some illustrative embodiments, sidewall spacers formed at the sidewalls of the respective gate electrodes may be manufactured so as to individually enhance the stress transfer mechanism in each transistor type. Moreover, in one or both transistor types, a strain-inducing crystalline semiconductor layer may be formed, such as a silicon/germanium layer, within the drain and source regions of a P-channel transistor, thereby providing an even more enhanced strain generating mechanism in the P-channel transistor. Consequently, the charge carrier mobility in each type of transistor may be efficiently increased, wherein a high degree of process and design flexibility is provided. For example, due to the provision of multiple stress-inducing sources in each type of transistor, the adjustment of transistor performance may be accomplished over a wide operating range for a given circuit design. Therefore, existing circuit designs, which take into account the typically encountered non-symmetry in performance of N-channel transistors and P-channel transistors with respect to charge carrier mobility, may still be used, since a gain in performance may be simultaneously obtained in both types of transistors in accordance with the principles of the present invention, thereby providing the potential for significantly enhancing the operating speeds of given circuit designs. Additionally, new circuit designs may be established, thereby taking advantage of the capability to specifically improve the performance of one type of transistor while substantially not negatively affecting the other type of transistor, thereby enabling enhanced circuit designs with a reduced asymmetry with respect to the behavior of N-channel and P-channel transistors.

Figure 1A:
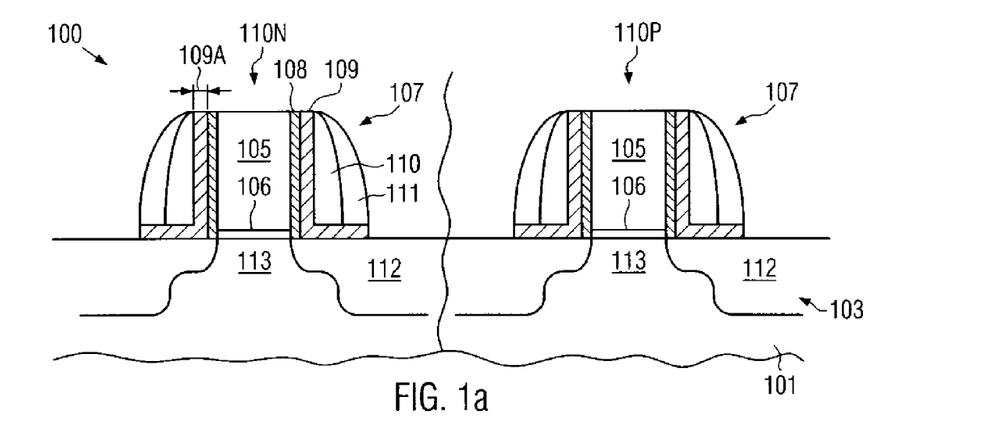
FIGS. 1a-1h schematically show cross-sectional views of a semiconductor device including two different types of transistors, such as a P-channel transistor and an N-channel transistor, receiving respectively stressed contact layers in close proximity to respective metal silicide regions in accordance with illustrative embodiments of the present invention.

With reference to FIGS. 1a-1h and 2a-2g, further illustrative embodiments of the present invention will now be described in more detail. FIG. 1a schematically illustrates a cross-sectional view of a semiconductor device 100 comprising a substrate 101, in and on which are formed a first transistor 110P and a second transistor 110N. The first and second transistors 110P, 110N differ in their conductivity type so that, for instance, the first transistor 110P may represent a P-channel transistor, such as a PMOS transistor, while the second transistor 110N may represent an N-channel transistor, such as an NMOS transistor. The substrate 101 may represent any appropriate substrate having formed thereon a substantially crystalline semiconductor layer 103 that enables the formation of the first and second transistor elements 110P, 110N. In one illustrative embodiment, the semiconductor layer 103 may represent a silicon-based semiconductor material, which may be formed on a buried insulating layer (not shown), which may be described in more detail later on, so that the substrate 101 may represent an SOI-like substrate. In other embodiments, the semiconductor layer 103 may be formed on top of a bulk semiconductor substrate, where the first and second transistor elements 110P, 110N may represent bulk transistor devices. The semiconductor layer 103 may have a thickness that is adapted to the specific design rules for the transistors 110P, 110N, for instance when these transistor elements represent SOI-like transistors. It should be understood that the term SOI-like transistor is to be considered as a generic term for any substrate and transistor formed thereon having at least one insulating portion, above which is formed a crystalline semiconductor layer that is appropriate for the formation of transistor elements therein. In one illustrative embodiment, the semiconductor layer 103 is designed so as to enable the formation of partially depleted transistor elements, while, in other embodiments, the thickness of the layer 103 may be appropriate for the formation of fully depleted devices or, in other cases, bulk devices may be formed in the layer 103. It should further be appreciated that the first transistor 110P and the second transistor 110N may be formed in close proximity to each other, wherein a corresponding isolation structure (not shown) may be provided, as is typically provided in sophisticated applications in the form of a shallow trench isolation. In other embodiments, the transistors 110P and ION may represent transistor elements provided in different die regions formed on the substrate 101.

Moreover, in this manufacturing stage, as shown in FIG. 1a, the first and second transistors 110P, 110N each comprise a respective gate electrode 105, separated from the semiconductor layer 103 by respective gate insulation layers 106. Moreover, corresponding spacer structures 107 are formed on sidewalls of the respective gate electrodes 105. The spacer structures 107 may comprise, in this stage of manufacturing, an offset spacer 108, which may be comprised of any appropriate material, such as silicon dioxide, followed by a conformal liner or spacer 109, which may exhibit a substantially L-shaped configuration, that is, the spacer 109 comprises a portion of a specified thickness 109A that extends along the sidewall of the gate electrode 105 and also comprises a portion having substantially the same thickness 109A that extends along a part of the semiconductor layer 103, in which respective drain and source regions 112 are formed. Consequently, the spacer 109 may be considered as a conformally formed liner or spacer, the shape of which substantially corresponds to the shape of the gate electrode 105, with a "horizontal" portion extending along a part of the drain and source regions 112, thereby separating one or more additional spacers 110, 111 from the gate electrode 105 and the drain and source regions 112. The spacers 110 and 111 may be formed of a dielectric material that may exhibit a significant etch selectivity with respect to the dielectric material of the spacer 109 in view of a specific etch recipe so as to enable a selective removal of the spacers 110, 111 while substantially maintaining the spacer 109, as will be described later on in more detail. For example, in one embodiment, the conformal or L-shaped spacer 109 may be comprised of silicon dioxide, while the one or more spacers 110, 111 may be comprised of silicon nitride. However, other regimes for the spacers 109, 110 and 111 may be contemplated. For instance, in one illustrative embodiment, the L-shaped spacer 109 may be comprised of silicon nitride, while the spacers 110, 111 may be formed of silicon dioxide. In one illustrative embodiment, the one or more spacers 110, 111 are formed without any intermediate liner material, as is typically the case in conventional transistor designs, so that in an actual device the spacers 110, 111, according to this specific embodiment, may not be distinguished by a corresponding sharp boundary as is shown in FIG. 1a. In still a further illustrative embodiment, the one or more spacers 110, 111 may be formed to exhibit a specific type of inherent stress, such as compressive stress or tensile stress, in order to enhance the strain generation in a respective channel region 113, thereby significantly enhancing the stress transfer mechanism, at least for one type of transistor, wherein the respective spacer elements 110, 111 for the other type of transistor may be removed, as will be explained later on in more detail.

A typical process flow for forming the semiconductor device 100 as shown in FIG. 1a may comprise the following processes. The substrate 101, when including a buried insulating layer, may receive the semiconductor layer 103, for instance, in the form of an undoped or pre-doped crystalline silicon layer, wherein the silicon layer may be formed by wafer bond techniques or any other well-established techniques for providing SOI substrates. In other cases, the semiconductor layer 103 may be formed by epitaxial growth techniques on the basis of a substantially crystalline template provided in the substrate 101. Thereafter, any isolation structures (not shown) may be formed on the basis of well-established recipes, such as photolithography and anisotropic etch techniques, followed by appropriate deposition and polishing techniques, when the formation of trench isolation structures is contemplated. Next, an appropriate dielectric layer may be formed by oxidation and/or deposition followed by the deposition of a gate electrode material, such as polysilicon or pre-doped polysilicon, which may be accomplished by well-established low pressure chemical vapor deposition (LPCVD) techniques.

Thereafter, the gate electrode material may be patterned on the basis of established techniques, for instance using an anti-reflective coating (ARC) layer for a subsequent lithography, wherein, depending on the process strategy, a resist mask or a hard mask or both may be used for patterning the gate electrode material to obtain the gate electrodes 105 and the respective gate insulation layers 106. Next, the offset spacer 108, if required, may be formed by depositing and/or oxidizing the device 100 and anisotropically removing vertical portions of the layer to form the spacers 108. Thereafter, an implantation sequence may be performed for obtaining a required lateral dopant profile as required for the complex concentration distribution in the drain and the source regions 112. It should be appreciated that a plurality of implantation sequences may have already taken place so as to provide a desired vertical dopant profile within the semiconductor layer 103 prior to the formation of the gate electrodes 105. Moreover, any pre-amorphization and/or halo implantation may have taken place after the formation of the gate electrodes 105. Thereafter, the conformal spacer 109 may be formed by initially depositing an appropriate dielectric material, such as silicon dioxide, with the specified thickness 109A in a highly conformal fashion, and, subsequently, a further spacer layer, for instance a silicon nitride layer, may be deposited on the basis of well-established recipes, such as plasma enhanced chemical vapor deposition (PECVD), wherein, as previously noted, the deposition parameters during the formation of the corresponding spacer layer may be adjusted such that a desired inherent stress is created in the layer as deposited. For example, during the deposition of silicon nitride, the deposition parameters, such as temperature, pressure, ion bombardment and the like, may be adjusted to obtain an intrinsic stress in the respective layer ranging from a compressive stress of approximately 1.5 GigaPascal or even more to a tensile stress of approximately the same magnitude. Thereafter, a selective anisotropic etch process may be performed to remove horizontal portions of the spacer layer, thereby forming the spacers 110. Depending on the complexity of the lateral dopant profile in the drain and source regions 112, a further implantation process may be performed on the basis of the spacers 110. Thereafter, depending on the device requirements, a further spacer layer may be deposited and patterned in accordance with the same processes as described above, thereby forming the spacer elements 111.

Thereafter, exposed portions of the layer including the base material of the spacers 109 may be removed by a selective etch process that exhibits a moderately high selectivity to silicon of the drain and source regions 112 and to the gate electrode 105 and to the spacers 110, 111. After the removal of exposed portions of the respective layer, the conformal, i.e., the substantially L-shaped, spacers 109 are formed. Prior to the removal of the respective exposed portions of the layer for forming the spacers 109, a further implantation process may be performed in order to obtain the required lateral dopant profile in the drain and source regions 112. It should be appreciated that the spacers 110, 111 may be formed in accordance with requirements of the corresponding dopant profile in the regions 112 so that a width of the respective spacers as well as the number thereof may be varied in accordance with requirements. For example, a single spacer element 110 may be sufficient or more than two spacer elements may be provided to act as an implantation mask for the formation of the drain and source regions 112. After each or some of the implantation cycles or after the very last implantation process, a corresponding anneal process may be carried out to substantially activate the implanted dopants and to substantially re-crystallize implantation-induced damage in the semiconductor layer 103. Next, one of the transistors, for instance the transistor 110N, may be covered by a hard mask to enable the formation of metal silicide regions in the other transistor, such as the transistor 110P, while avoiding or at least significantly reducing any influence of the silicidation process on the covered transistor element.

Figure 1B:
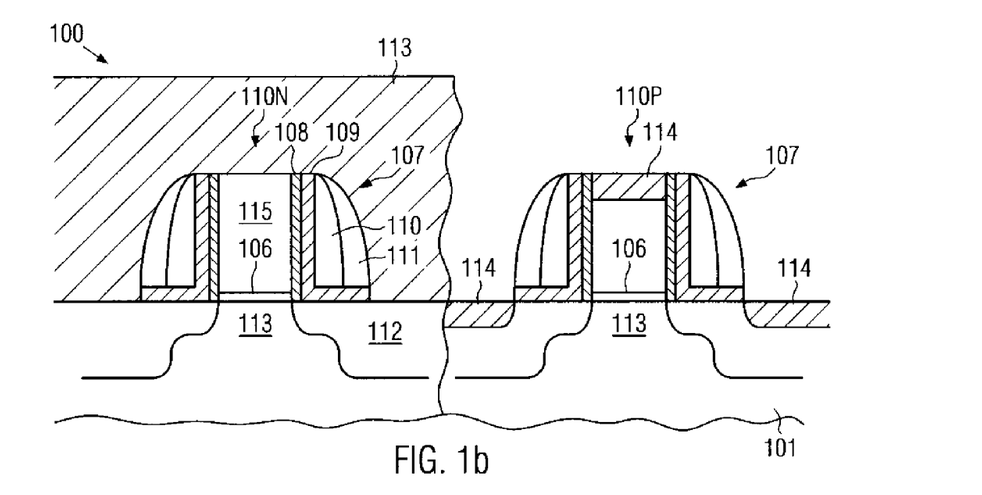

FIG. 1b schematically shows the semiconductor device 100 in a further advanced manufacturing stage, in which the second transistor 110N is covered by a hard mask 113, while the first transistor 110P is exposed. Furthermore, the first transistor 110P comprises metal silicide regions 114 formed in the gate electrode 105 and the drain and source regions 112. In one illustrative embodiment, the metal silicide regions 114 may comprise nickel or nickel/platinum, which may be advantageously used in combination with transistor elements containing a significant amount of non-silicon material in the drain and source regions 112, such as silicon/germanium, as will be described later on in more detail. In other embodiments, the metal silicide regions 114 may comprise any other appropriate refractory metal, such as titanium, cobalt, tungsten, platinum and the like. Moreover, it should be appreciated that the metal silicide regions 114, although indicated by the same reference numeral, may, in some embodiments, be comprised of different materials, depending on the process and device requirements.

The semiconductor device 100 as shown in FIG. 1b may be formed by depositing an appropriate hard mask material, which, in one illustrative embodiment, may be comprised of substantially the same material as is also used for the spacer elements 110, 111, while, in other illustrative embodiments, a different dielectric material may be used. The material for the hard mask 113 is selected to withstand the temperatures associated with the formation of metal silicide regions. It may be comprised of a variety of materials other than photoresist materials. For example, the hard mask 113 may be comprised of silicon nitride, silicon dioxide and the like. The hard mask layer as deposited may be patterned on the basis of well-established lithography, wherein respective and well-established selective etch recipes may be used for removing the layer above the first transistor 110P. In the embodiment shown, the hard mask 113 may be comprised of silicon dioxide, which may be removed selectively to the material of the spacer elements 110, 111 of the first transistor 110P and also selectively to the gate electrode 105 and the drain and source regions 112 of the transistor 110P. Thereafter, a silicidation process may be performed, for instance on the basis of nickel, nickel/platinum or any other appropriate refractory metal, wherein a metal deposition and an appropriately designed heat treatment may be performed for forming the metal silicide regions 114. Next, the semiconductor device 100 may receive a resist mask, which covers the first transistor 110P after the formation of the metal silicide regions 114, while exposing the hard mask 113 that may be removed in a subsequent etch process.

Figure 1C:
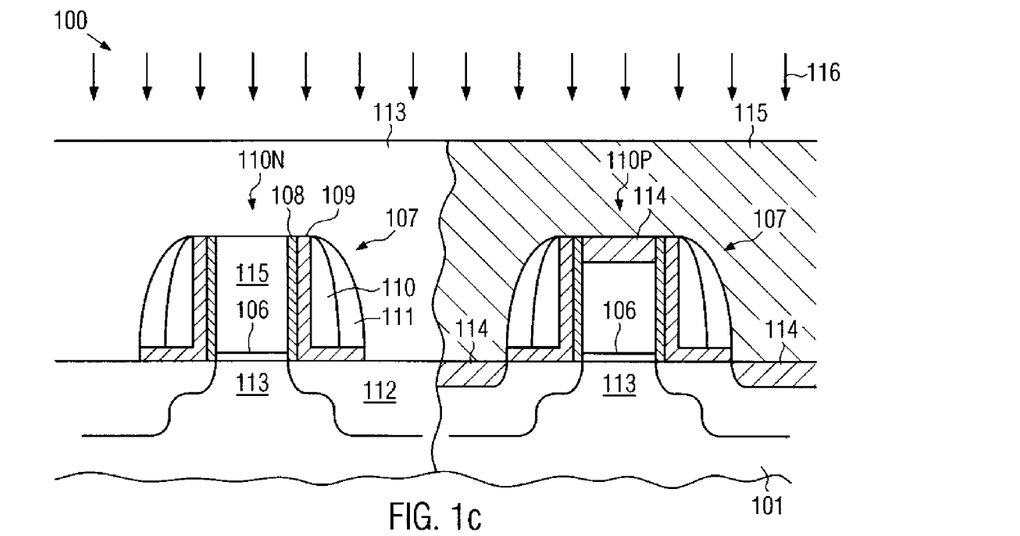

FIG. 1c schematically shows the device 100 with a resist mask 115 formed above the transistor 110P to protect this transistor 110P while performing a dry etch process 116 for removing the hard mask 113. The etch process 116 is designed such that it exhibits a high etch selectivity to the material of the drain and source regions 112 and the gate electrode 105 of the second transistor 110N. Corresponding etch recipes are well-established in the art. As previously pointed out, a plurality of strategies may be applied for the formation of the spacer structure 107 in combination with providing a hard mask 113. For example, as previously explained, the conformal spacer 108 may, for instance, be comprised of silicon nitride, whereas the spacers 110, 111 may be formed of silicon dioxide, wherein the hard mask 113 may be formed of silicon nitride according to the process flow as described above with reference to FIG. 1b. That is, during the formation of the hard mask 113, the spacer elements 110, 111 of the first transistor 110P may be maintained during the respective patterning process. In other etch regimes, the hard mask 113 may be provided as the same material as the spacers 110, 111, for instance in the form of silicon dioxide or silicon nitride, and correspondingly the spacers 110, 111 of the first transistor 110P may be removed during the patterning of the hard mask 113 so that the conformal spacer 109 of the first transistor 110P is left (not shown).

In a further variance, the conformal spacer 109 may be comprised of silicon dioxide and the spacers 110, 111 may be comprised of silicon nitride, while the hard mask 113 is comprised of silicon dioxide and the spacers 110, 111 are maintained during the patterning of the hard mask 113. In this regime, it may be advantageous to provide the spacers 110, 111 with a specific intrinsic stress, as is explained previously with reference to FIG. 1a, so that, for instance, the stress transfer mechanism in the first transistor 110P, in which the spacers 110, 111 may be maintained during the further processing, may be significantly enhanced. This may be advantageous compared to removing the spacers 110, 111, when the fabrication of the spacers 110, 111 may be performed with more inherent stress compared to a subsequent deposition of a contact layer, which then may be located next to the sidewalls of the gate electrodes.

During the further description, it may be assumed that the etch process 116 may remove the hard mask 113 and may also remove the spacer elements 110, 111 of the second transistor 110N, irrespective of whether this may be accomplished in a single etch step, when the hard mask 113 and the spacers 110, 111 are comprised of substantially the same material, or whether an additional etch step is required for removing the spacers 110, 111 after having removed the hard mask 113. It should be appreciated that, in embodiments in which the spacers 110, 111 may be removed commonly with the hard mask 113 in a single process, the spacers 110 and 111 of the first transistor 110P may have been removed during the patterning of the hard mask 113, thereby leaving the conformal spacer 109 in the first transistor 1110P.

Figure 1D:
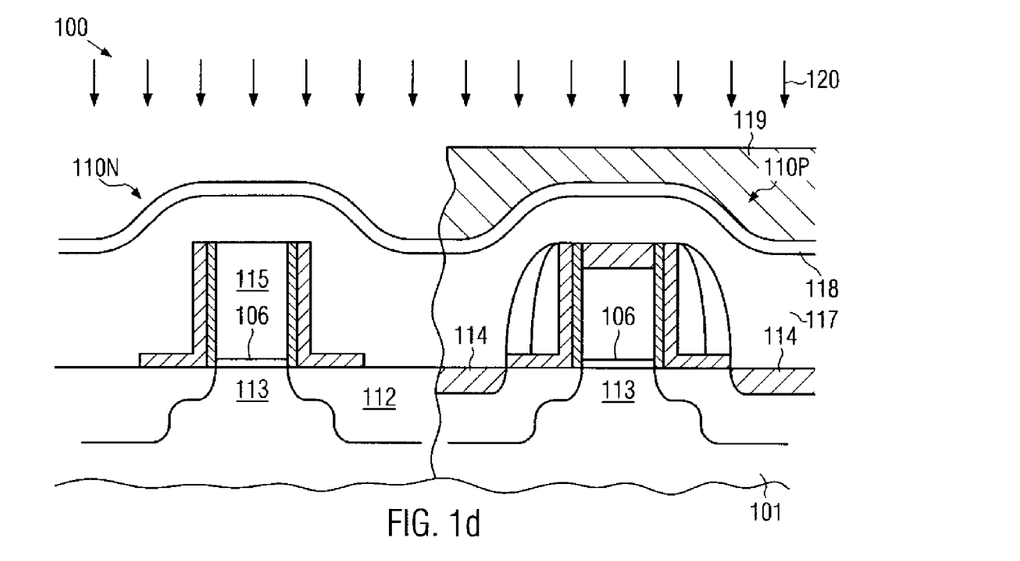

FIG. 1d schematically shows the semiconductor device 100 in a further advanced manufacturing stage. The device 100 comprises a first contact layer 117 formed on the first and second transistors 110P, 110N, wherein the first contact layer 117 comprises a first type of intrinsic stress so as to induce a corresponding strain in the respective channel regions 113. For example, the first contact layer 117 may be comprised of silicon nitride having an intrinsic compressive stress when the first transistor 110P is to represent a P-channel transistor. Consequently, in this case, the spacer elements 110 and 111 may have also been formed to exhibit an intrinsic compressive stress to support the stress transfer mechanism provided by the contact layer 117. In the illustrative embodiment shown, the first contact layer 117 is formed in close proximity to the transistor 110P, wherein, in one embodiment, the first contact layer 117 is formed directly on the respective metal silicide regions 114 formed on the source/drain regions. Moreover, an etch stop layer or etch indicator layer 118 may be formed on or above the first contact layer 117, wherein the layer 118 may be formed of an appropriate material that enables a reliable control of a subsequent etch process for removing a second contact layer (not shown) over the first transistor 110P, as will be described later on. For example, the etch stop or etch indicator layer 118 may be provided in the form of a silicon dioxide layer. Moreover, a mask 119, such as a resist mask and the like, may be formed above the device 100 to expose the second transistor ION while covering the first transistor 110P. The device 100 may be subjected to an appropriately designed etch process 120 for removing the exposed portions of the layers 118 and 117.

The device 100 as shown in FIG. 1d may be formed in accordance with the following processes. After the removal of the hard mask 113 by the etch process 116 (FIG. 1c), the resist mask 115 may be removed on the basis of a well-established oxygen plasma-based process, followed by any appropriate cleaning processes. Thereafter, a PECVD process may be performed for depositing the first contact layer 117, for instance as a silicon nitride layer, wherein, as previously explained, the deposition parameters may be adjusted in such a way that a desired type and magnitude of an intrinsic stress is provided in the first contact layer 117. Corresponding deposition conditions are well-established in the art. For example, the first contact layer 117 may be deposited so as to have a specific magnitude of compressive stress when the first transistor 110P is to represent a P-channel transistor. Thereafter, the etch stop or etch indicator layer 118 may be deposited on the basis of well-established PECVD techniques. Next, the mask 119, for instance in the form of a resist mask, may be formed and patterned by photolithography, and thereafter the etch process 120 may be performed on the basis of wet and/or dry chemical etch processes as are well-established in the art for a plurality of dielectric materials. For example, in a first step, the exposed portion of the layer 118 may be removed and the exposed portion of the first contact layer 117 may be subsequently selectively etched with respect to the material of the gate electrode 105 and the drain and source regions 112 and the conformal spacer 109 of the second transistor 110N. It should be appreciated in this respect that substantially no metal contamination may occur in the device 100 due to the still missing metal silicide regions in the second transistor 110N. Consequently, the exposed portion of the contact layer 117 may be reliably removed without undue damage or metal contamination of the device 100. Thereafter, a further silicidation process may be performed in order to form respective metal silicide regions in the second transistor 110N, while the first contact layer 119 in combination with the layer 118 acts as a silicidation mask.

Figure 1E:
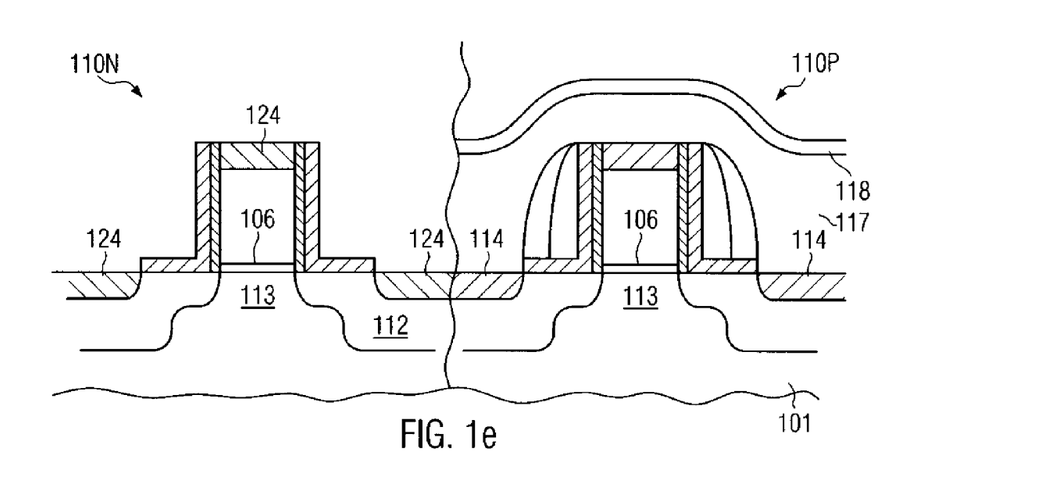

FIG. 1e schematically shows the semiconductor device 100 after the completion of the further silicidation process. Hence, the second transistor 110N comprises corresponding metal silicide regions 124 in the drain and source regions 112 and the gate electrode 105. In some embodiments, the metal silicide regions 124 may be comprised of substantially the same material composition as the respective metal silicide regions 114 in the first transistor 110P, whereas, in other embodiments, a different metal silicide may be formed in accordance with device requirements. For example, in some embodiments, it may be considered appropriate to form the first metal silicide regions 114 on the basis of a refractory metal that may form a metal silicide compound, which may exhibit a higher degree of thermal stability compared to the metal silicide in the regions 124, so that the silicidation process for forming the regions 124 may not substantially negatively influence the metal silicide regions 114. In other embodiments, substantially the same silicidation process may be performed in the second transistor 110N. During the silicidation process, irrespective of whether the same or a different metal silicide is formed in the regions 124, the remaining portion of the first contact layer 117 in combination with the layer 118 acts as a silicidation mask to avoid or at least significantly reduce any deleterious effects of the silicidation process in the second transistor with respect to the metal silicide regions 114. After the formation of the metal silicide regions 124, further processing may be continued by the formation of a second contact layer having a second type of intrinsic stress selected for enhancing the performance of the second transistor 110N.

Figure 1F:
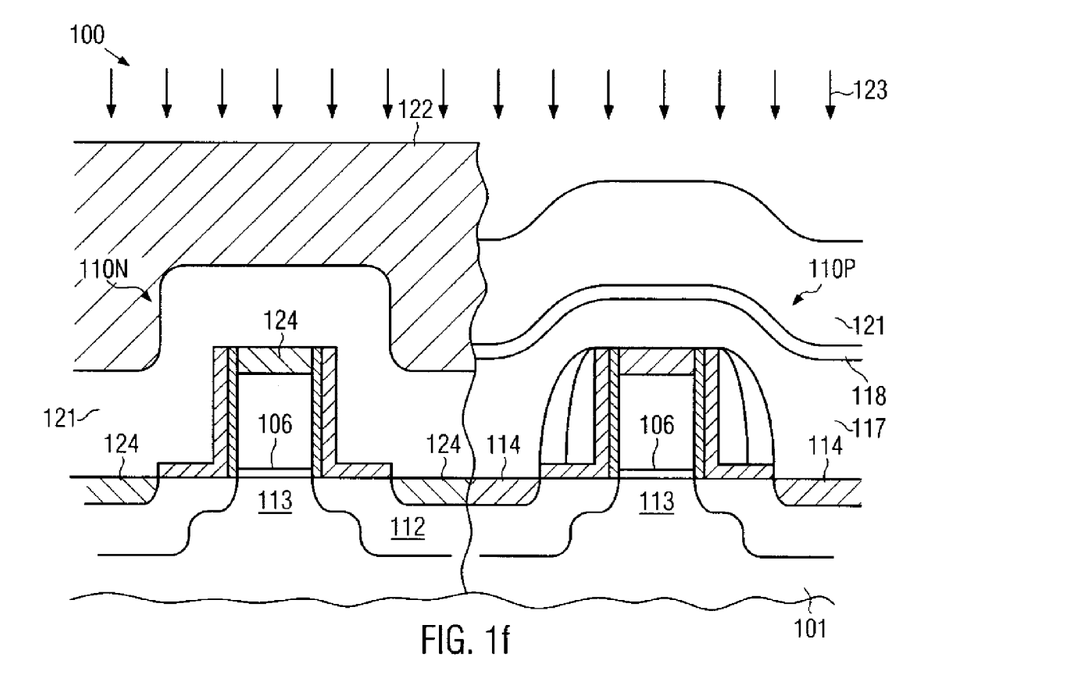

FIG. 1f schematically shows the semiconductor device 100 after the formation of a second contact layer 121, which may be comprised, in one illustrative embodiment, of silicon nitride having a desired magnitude and type of intrinsic stress, such as a tensile stress of a specified magnitude, when the transistor 110N is to represent an N-channel transistor. The second contact layer 121 is also formed above the first transistor 110P and may be removed on the basis of a further mask 122, such as a resist mask, which exposes the first transistor 110P while covering the second transistor 110N and the respective portion of the second contact layer 121. Furthermore, the semiconductor device 100 is subjected to an etch process 123 for removing the second contact layer 121 above the first transistor 110P, wherein, as previously explained, the etch stop layer or etch indicator layer 118 may enable reliable control of the removal of the exposed portion of the second contact layer 121 without unduly affecting or damaging the first contact layer 117. For example, highly selective etch recipes for silicon nitride and silicon dioxide are well established in the art and may be used during the etch process 123. Thereafter, the resist mask 122 may be removed on the basis of well-established resist removal processes on the basis of an oxygen plasma.

Figure 1G:
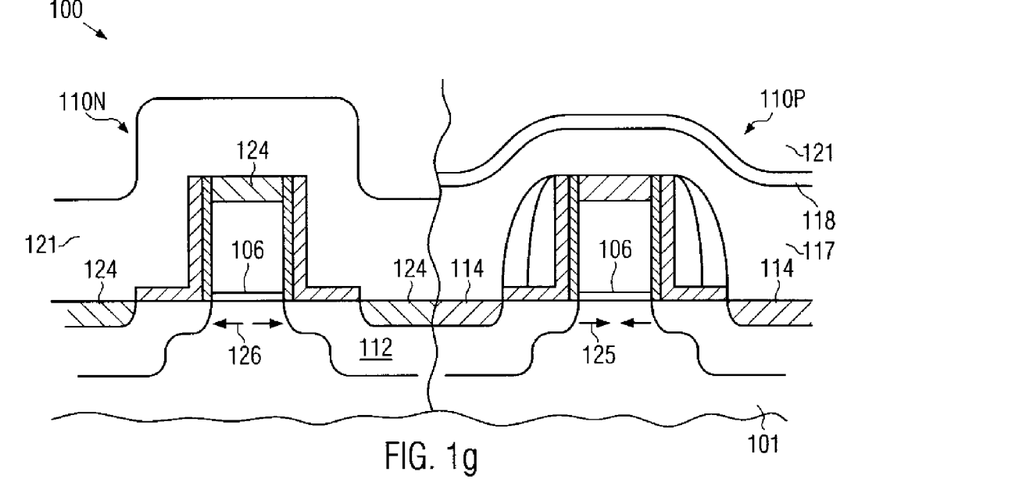

FIG. 1g schematically shows the semiconductor device after the completion of the above-described process sequence. Consequently, the semiconductor device 100 comprises the first transistor 110P having formed thereon the first contact layer 117 which exhibits the first type of intrinsic stress, such as a compressive stress, wherein, additionally, the spacer elements 110, 111 may have been maintained and may also exhibit the first type of stress, or, in other embodiments, the spacers 110, 111 may have been removed in a previous etch process, as is for instance described with reference to FIGS. 1b and 1c. Also, in this case, a dielectric material having the first type of stress is formed on the respective conformal spacer 109, due to the provision of the first contact layer 117 which may then have been formed similarly to the second contact layer 121, thus also providing an effective stress transfer mechanism into the channel region 113 of the first transistor 110P. For example, if the first contact layer 117 is compressively stressed, a corresponding compressive strain 125 may be induced in the channel region 113. Similarly, the second contact layer 121 may provide a respective strain of a second type, such as a tensile strain 126, within the respective channel region 113, wherein the contact layer 121 is also formed in close proximity to the gate electrode 105 and the drain and source regions 112, thereby enhancing the overall stress transfer mechanism for the second transistor 110N, irrespective of the strain mechanism in the first transistor 110P. Consequently, the stress transfer may be adjusted separately for both transistor types substantially without unduly affecting the metal silicide regions 114 and 124, since each of the metal silicide regions is formed on the basis of a respective silicidation mask, that is on the basis of the hard mask 113 (FIG. 1b) and the patterned first contact layer 117 (FIG. 1e).

It should further be appreciated that the above-described process technique may also be applied when, for instance, the second transistor is to represent a P-channel transistor, while the first transistor may represent an N-channel transistor. For instance, in a corresponding arrangement, the first metal silicide regions 114 may be formed of any appropriate metal silicide, such as cobalt silicide, which may be formed at an elevated temperature, whereas the metal silicide regions 124 may be provided in the form of nickel silicide or nickel/platinum silicide, requiring less elevated temperatures, thereby reducing any deleterious effect on the first metal silicide regions 114. A corresponding difference in metal silicide may also be used for balancing any asymmetry in the device behavior of the first and second transistor devices 110P, 110N due to the difference in conductivity of, for instance, nickel silicide with respect to cobalt silicide. Moreover, a provision of two types of metal silicide may be considered appropriate when significant amounts of other semiconductor materials, such as germanium, carbon and the like, may be present in the gate electrode 105 and/or the drain and source regions 112, as will be explained with reference to FIG. 1h.

Figure 1H:
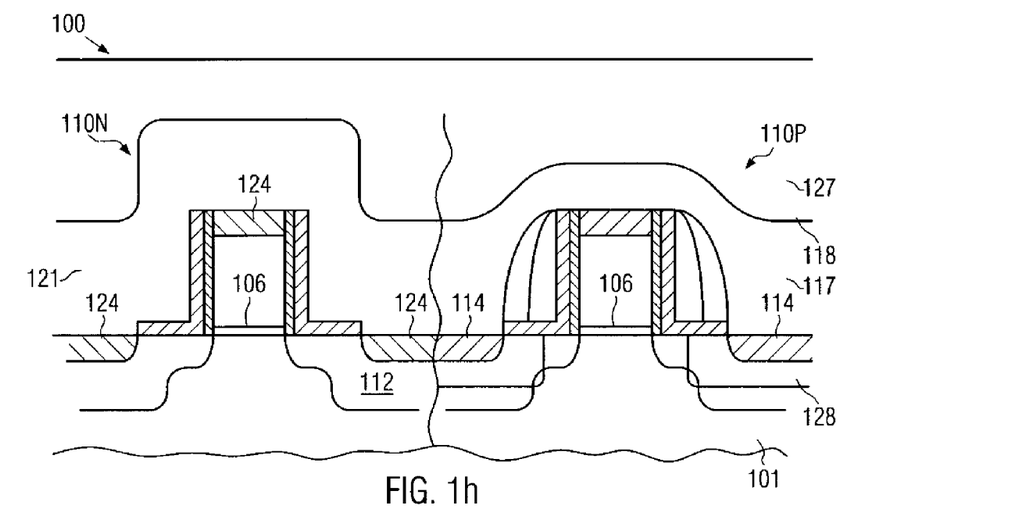

FIG. 1h schematically shows the semiconductor device 100 in a further advanced manufacturing stage, wherein an interlayer dielectric material is formed above the first and second contact layers 117 and 121 to complete an interlayer dielectric material layer 127, in which corresponding contacts are to be formed to respective contact regions of the transistors 110P and 110N, such as the gate electrodes 105 and the drain or source regions 112. Moreover, in the embodiment shown in FIG. 1h, the first transistor 110P may additionally comprise a strain-inducing semiconductor layer 128, which, in one illustrative embodiment, may be provided in the form of a silicon/germanium layer having an amount of approximately 1-30 atomic percent germanium. Thus, the semiconductor layer 128 may represent a silicon/germanium layer, which typically has a slightly greater lattice spacing, thereby additionally creating a respective compressive strain in the channel region 113. In this case, the respective metal silicide regions 114 may be substantially comprised of nickel silicide or nickel/platinum silicide, which may be reliably formed within a silicon/germanium material, wherein the metal silicide regions 124 may be comprised of the same material, with respect to the thermal budget of the metal silicide regions 114, or may be comprised of a different metal silicide. In this case, the above-described process sequence may be re-designed such that the metal silicide regions 124 are formed first followed by the deposition of the second contact layer 121, wherein the hard mask 113 may be provided above the first transistor 110P to act as a silicidation mask. In this way, increased anneal temperatures during the formation of the second metal silicide regions 124 may be tolerable when a different type of metal silicide is to be used, such as cobalt silicide and the like, while subsequently the first metal silicide regions 114 on the basis of nickel or nickel/platinum may be formed on the basis of appropriate temperatures, which may not exceed approximately 400° C., thereby not substantially negatively affecting the nickel silicide regions 124. In still other embodiments, the first and second metal silicide regions 124 and 114 are comprised of substantially the same materials, as in the sequence as described above with reference to FIGS. 1a-1g. It should be appreciated that the embedded semiconductor layer 128, irrespective of whether it is provided only in one of the transistors or in both, may be formed on the basis of selective epitaxial growth techniques, wherein, after the formation of the gate electrodes 105, a corresponding recess may be formed adjacent thereto, in which the desired semiconductor compound is epitaxially grown to form the strain-inducing layer 128.

As a result, highly efficient stress sources may be provided for different types of transistors, such as the first and second transistors 110P, 110N in that the contact layers, such as the layers 117 and 121, are formed in close proximity to the respective transistor elements and, in one illustrative embodiment, are formed directly on the respective metal silicide regions of these transistors substantially without creating metal contamination or other damage in the respective metal silicide regions. For this purpose, the metal silicide formation process is performed on the basis of respective silicidation masks separately for each transistor type so that a selective removal of the respective contact layer that is to be deposited first may be performed without an underlying etch stop layer, thereby avoiding any metal contamination, since the metal silicide is yet to be formed on this exposed transistor element. During the subsequent formation of the second metal silicide, the contact layer, in combination with an overlying etch stop layer above the other transistor element, may be advantageously used as a second silicidation mask, thereby significantly reducing any effects of the second silicidation process on the previously formed metal silicide regions. Thereafter, the second contact layer may also be directly deposited on the exposed metal silicide regions, thereby significantly enhancing the stress transfer mechanism and also providing significantly increased design flexibility for adjusting the transistor performance of the respective transistor types.

Figure 2A:
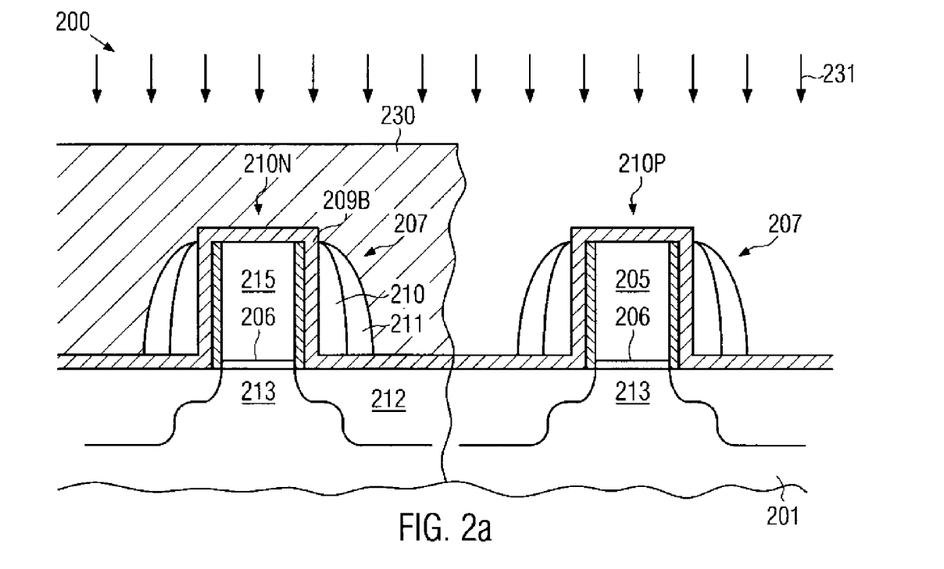
FIGS. 2a-2g schematically show cross-sectional views of a semiconductor device including two different types of transistors, each receiving a stressed contact layer according to alternative embodiments of the present invention.

With reference to FIGS. 2a-2g, further illustrative embodiments of the present invention will now be described in more detail. FIG. 2a schematically shows a cross-sectional view of a semiconductor device 200 comprising a first transistor 210P and a second transistor 210N formed above a substrate 201. The semiconductor device 200 as shown in FIG. 2a may be similar to the device 100 as shown in FIG. 1a and thus a detailed description of the various components is omitted here for the sake of brevity. Thus, the first and second transistors 210P, 210N may each comprise drain and source regions 212 and a gate electrode 205 with a respective spacer structure 207, which may include in this stage of manufacture a liner 209B of a specified thickness that is conformally formed above the respective transistor elements and one or more spacers 210, 211 formed at the sidewalls of the gate electrodes 205 on the conformal liner 209B. With respect to the material composition as well as the processes for forming the semiconductor device 200, the same criteria apply as previously explained with reference to the device 100 shown in FIG. 1a, wherein especially the formation processes and the material composition of the spacer structure 207 may correspond to that of the spacer structure 107. Moreover, a resist mask 230 may be formed such that the first transistor 210P is exposed while the second transistor 210N is covered. Furthermore, a selective etch process 231 may be performed in order to remove exposed portions of the liner 209B above the first transistor 210P.

Figure 2B:
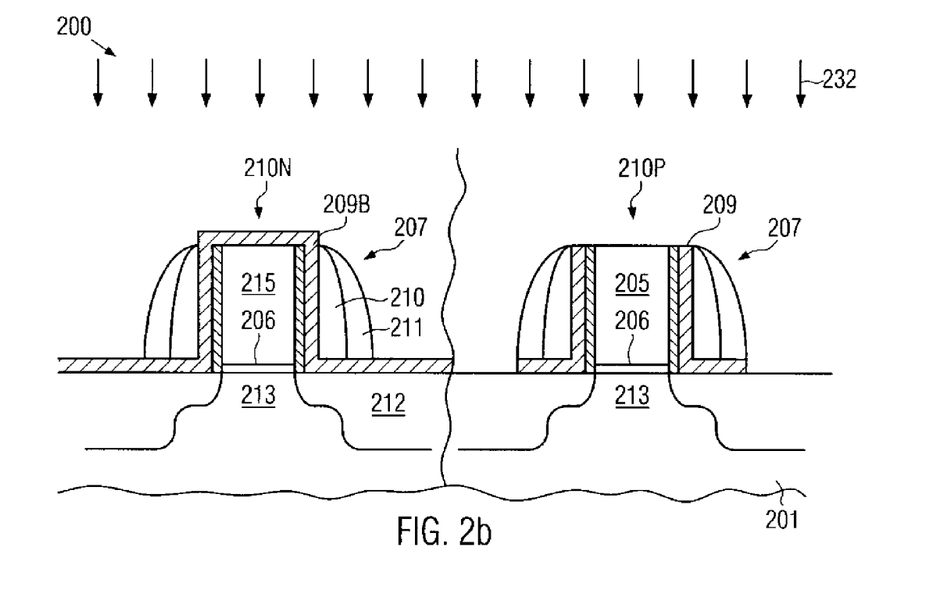

FIG. 2b schematically shows the semiconductor device 200 after the completion of the etch process 231, thereby leaving behind in the first transistor element 210P conformal spacer elements 209 within the respective spacer structure 207. Moreover, according to one illustrative embodiment, the device 200 may be subjected to a further etch process 232, which may be designed for removing the spacers 210, 211 in one or both of the transistor elements 210P, 210N. For example, as previously explained, the liner 209B may be comprised of a different material compared to the spacers 210, 211, thereby enabling the employment of well-established selective etch recipes for removing the spacer elements 210, 211. For example, a selective etch process may be comprised in the process 232 to selectively remove silicon nitride with respect to silicon dioxide and silicon. In still other embodiments, a further resist mask (not shown) may be formed to cover the first transistor 210P during the etch process 232, thereby avoiding any undue damage of the crystalline areas in the drain and source regions 212 of the first transistor 210P. In this case, in some embodiments, the spacer elements 210 and 211 may have been formed to exhibit a specified intrinsic stress that is appropriate for enhancing the stress transfer mechanism in the first transistor 210P. For example, when the first transistor 210P is to represent a P-channel transistor, the spacers 210, 211 in the first transistor 210P may have been formed with a compressive stress. In the further description, it may be assumed that the spacers 210, 211 in both transistors are removed in a common etch process.

Figure 2C:
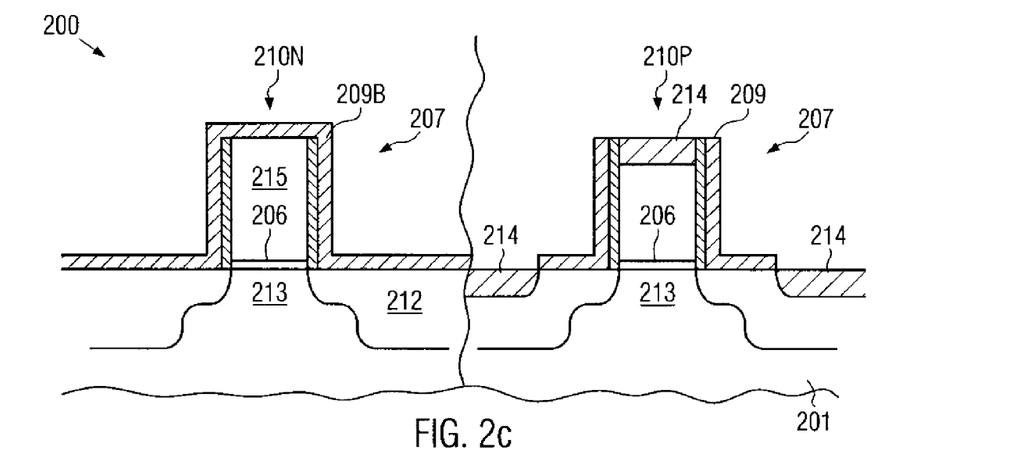

FIG. 2c schematically shows the semiconductor device 200 after the completion of the etch process 232, with the spacer elements 210, 211 removed in both transistors 210P, 210N. Moreover, the first transistor 210P may comprise first metal silicide regions 214 formed in the gate electrodes 205 and the drain and source regions 212. The metal silicide regions 214 may be formed in accordance with the same processes as are previously described with reference to the metal silicide regions 114, wherein the liner 209B and the conformal spacers 209 formed in the second transistor 210N and the first transistor 210P, respectively, act as a silicidation mask.

Figure 2D:
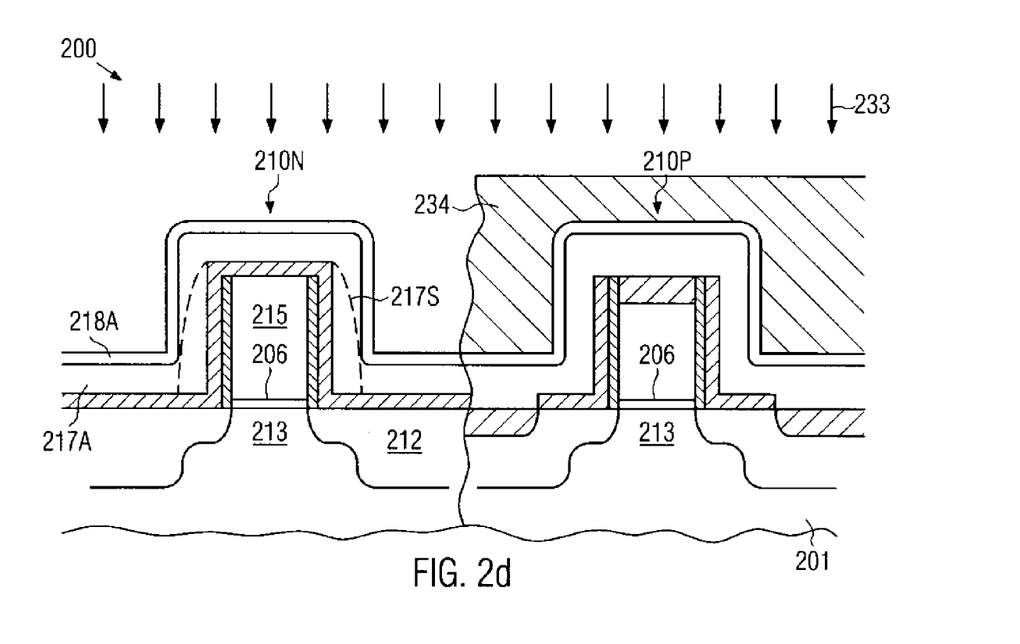

FIG. 2d schematically shows the semiconductor device 200 in a further advanced manufacturing stage. In this stage, a first sub-layer 217A of a first contact layer is formed above the first and second transistor elements, wherein the first sub-layer 217A is, in one illustrative embodiment, directly formed on the respective silicide regions 214. Moreover, an etch stop layer 218A is formed on the first sub-layer 217A. The first sub-layer 217A, which may be comprised of silicon nitride, may exhibit a first type of intrinsic stress selected to be appropriate for the strain creation in the first transistor 210P. Moreover, a thickness of the first sub-layer 217A may be selected such that appropriate spacer elements may be formed in the second transistor 210N during a further anisotropic etch process 233, which may be performed on the basis of a further resist mask 234 that covers the first transistor 210P while exposing the second transistor 210N. Consequently, during the etch process 233, first the exposed etch stop layer 218A may be removed and subsequently the first sub-layer 217A may be anisotropically etched to form corresponding spacer elements, which are shown as dashed lines and are indicated as 217S. Corresponding anisotropic etch processes are well-established in the art. Based on the remaining spacers 217S, exposed portions of the liner 209B may be selectively etched to form corresponding L-shaped spacers on the second transistor 210N. In still other embodiments, when the specific stress of the first type of the sub-layer 217A may not be considered inappropriate for the performance of the second transistor 210N, the spacers 217S may be maintained throughout the subsequent processing.

Figure 2E:
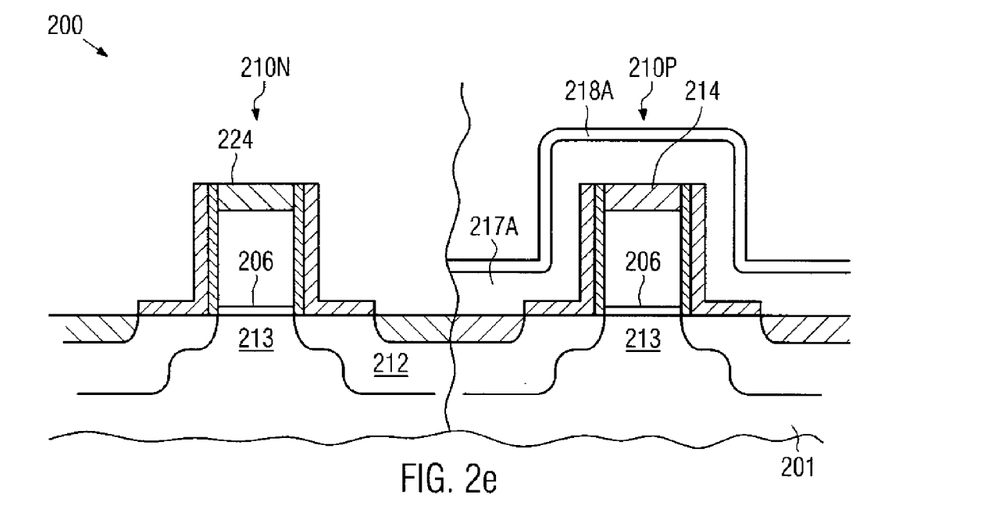

FIG. 2e schematically shows the semiconductor device 200 after the completion of the above-described etch process 233 and the removal of the resist mask 234. Consequently, L-shaped or conformal spacers 209 are also formed in the second transistor 210N. Furthermore, second metal silicide regions 224 may be formed in the gate electrode 205 and the drain and source regions 212 of the second transistor 210N. With respect to the material composition of the second metal silicide regions 224, the same criteria applies as previously explained with reference to the metal silicide regions 124. Thereafter, further processing may be continued by forming a second contact layer above the semiconductor device 200.

Figure 2F:
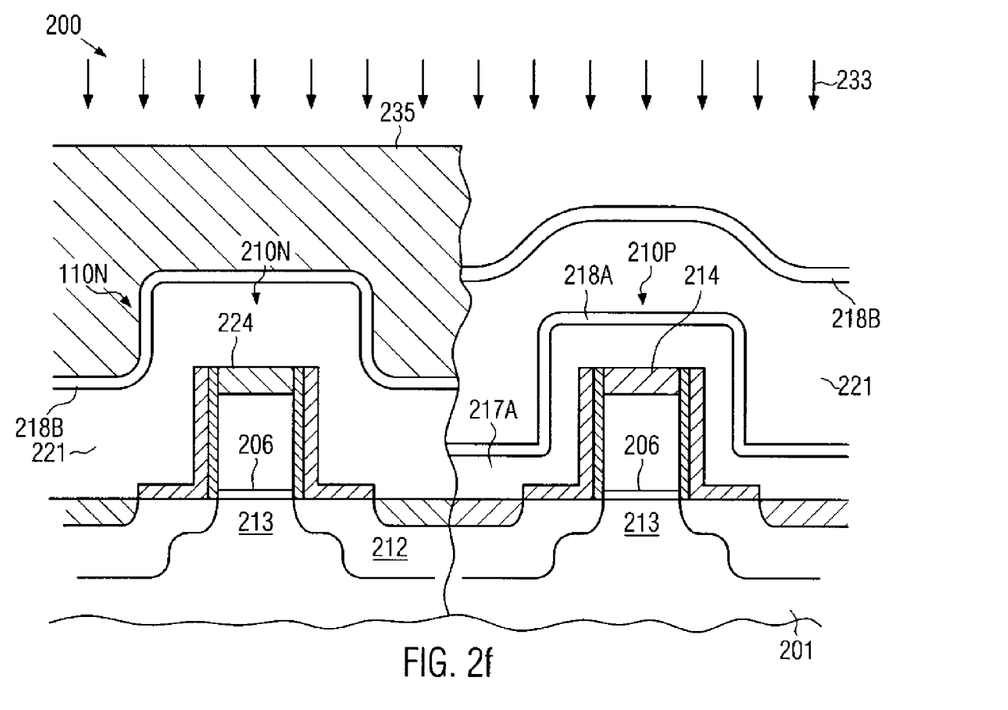

FIG. 2f schematically shows the semiconductor device 200 after the formation of a second contact layer 221 having a second type of intrinsic stress that is appropriate for enhancing the performance of the second transistor 210N. Moreover, a further etch stop layer 218B may be formed on the second contact layer 221. For example, the second contact layer 221 may be comprised of silicon nitride while the etch stop layer 218B may be formed of silicon dioxide. Furthermore, a resist mask 235 may be formed in order to cover the second transistor 210N while exposing the second contact layer 221 and the respective etch stop layer 218B formed above the first transistor 210P. With respect to the formation of the contact layer 221 and the resist mask 235, well-established process techniques may be used, as are also explained previously with reference to FIGS. 1a-1h. Moreover, an etch process 236 may be performed to remove the exposed portion of the etch stop layer 218B and subsequently the exposed portion of the second contact layer 221, wherein the corresponding etch process may be stopped by means of the etch stop layer 218A.

Figure 2G:
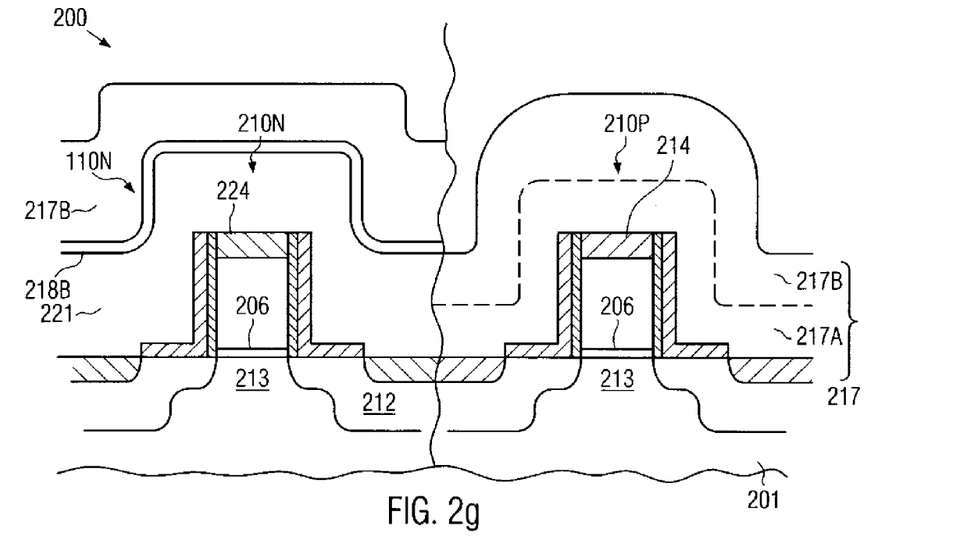

FIG. 2g schematically shows the semiconductor device 200 after the completion of the above-described process sequence, wherein additionally a second sub-layer 217B of a first contact layer 217, which may be commonly formed by the first sub-layer 217A and the second sub-layer 217B, is formed above the first and second transistor elements 210P, 210N. The second sub-layer 217B may also comprise the first type of intrinsic stress, wherein a thickness of the second sub-layer 217B is selected in accordance with device requirements so as to obtain a required total thickness for the contact layer 217, i.e., the sub-layers 217A and 217B. Thereafter, the second sub-layer 217B may be removed from the second transistor element 210N on the basis of the etch stop layer 218B similarly as is described with reference to FIG. 1g. Consequently, the respective contact layers 221 and 217 may be formed in close proximity to, and in particular embodiments directly on, the respective metal silicide regions 214, 224, thereby providing an efficient stress transfer mechanism. Moreover, the provision of a hard mask, such as the hard mask 113, in combination with a corresponding resist mask as is described, for instance, with reference to FIG. 1e, may not be required, thereby relaxing any constraints with respect to a corresponding etch process for removing the hard mask selectively to the resist mask and selectively to the silicon regions from which the respective hard mask is to be removed. It should also be appreciated that other stress-inducing mechanisms or sources may be provided in the semiconductor device 200 as is also described with reference to FIG. 1h. That is, a corresponding strain-inducing crystalline semiconductor layer may be provided in the drain and source regions of one or both of the first and second transistors 210P, 210N.

As a result, the present invention provides an enhanced technique and a semiconductor device having a significantly enhanced stress transfer mechanism for both N-channel transistors and P-channel transistors, wherein the potential for metal silicide contamination or damage is significantly reduced while on the other hand respective contact layers may be directly formed on the respective metal silicide regions. For this purpose, the formation of the respective metal silicide regions is separately performed for each transistor type, while the other transistor is masked by a corresponding silicidation mask, and the selective removal of a non-desired portion of a first contact layer may be accomplished without requiring an additional etch stop layer, which may otherwise compromise the stress transfer efficiency. Consequently, a gain in performance may be achieved for both types of transistors, thereby providing a high degree of design flexibility, wherein, in some illustrative embodiments, existing circuit designs taking into consideration the asymmetry between the performance of N-channel and P-channel transistors may still be used, however, with an overall increase of performance. Moreover, due to the decoupling of the respective processes for forming the metal silicide and thus of the respective contact layers, the stress engineering may gain more design flexibility, thereby providing the potential for designing new circuit layouts in which each type of transistor is specifically configured for individual performance optimization.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first metal silicide in a gate electrode and drain and source regions of a first transistor while covering a second transistor with a first silicidation mask;
   forming a second metal silicide in a gate electrode and drain and source regions of a second transistor while covering said first transistor having said first metal silicide with a second silicidation mask;
   selectively forming a first contact layer having a first type of intrinsic stress above said first transistor; and
   selectively forming a second contact layer having a second type of intrinsic stress above said second transistor.

2. The method of claim 1, wherein forming said second metal silicide comprises forming said first contact layer above said first and second transistors, selectively removing said first contact layer above said second transistor and forming said second metal silicide in said second transistor while using a non-removed portion of said first contact layer as said second silicidation mask.

3. The method of claim 1, wherein selectively forming said first contact layer comprises forming at least one of an etch indicator layer and an etch stop layer on said first contact layer.

4. The method of claim 3, wherein selectively forming said second contact layer comprises forming said second contact layer above said second transistor and said at least one of an etch indicator layer and an etch stop layer located above said first transistor and selectively removing said second contact layer above said first transistor while using said at least one of an etch indicator layer and an etch stop layer for stopping the removal process.

5. The method of claim 1, further comprising forming one or more spacer elements adjacent to sidewalls of said gate electrodes of said first and second transistors, wherein said one or more spacer elements are separated from said gate electrodes and said drain and source regions by a liner.

6. The method of claim 5, wherein said one or more spacer elements are formed without an intermediate liner.

7. The method of claim 6, wherein said one or more spacer elements are formed so as to have said first type of intrinsic stress.

8. The method of claim 5, further comprising removing said one or more spacer elements formed on sidewalls of said gate electrode of said second transistor prior to selectively forming said second contact layer.

9. The method of claim 8, wherein said one or more spacer elements and said first silicidation mask are removed in a common etch process.

10. The method of claim 1, wherein said first and second contact layers are formed on said first and second metal silicide regions, respectively.

11. The method of claim 1, further comprising forming a strain-inducing crystalline layer in the drain and source regions of at least one of said first and second transistors prior to forming said first metal silicide.

12. The method of claim 1, further comprising forming a liner above said first and second transistors, forming one or more spacer elements at sidewalls of said gate electrodes of said first and second transistors and selectively removing said liner from said first transistor, wherein a non-removed portion of said liner above said second transistor acts as said first silicidation mask.

13. The method of claim 12, further comprising, after forming said first metal silicide, forming a first sub-layer of said first contact layer, said first sub-layer having said first type of stress, and forming an etch stop layer on said first sub-layer.

14. The method of claim 13, further comprising selectively removing said first sub-layer and said etch stop layer above said second transistor and forming said second metal silicide using a non-removed portion of said first sub-layer and said etch stop layer as said second silicidation mask.

15. The method of claim 14, wherein said second contact layer is formed on said second metal silicide and on said etch stop layer and said second contact layer is selectively removed above said first transistor using said etch stop layer as an etch mask.

16. The method of claim 15, further comprising removing said etch stop layer and forming a second sub-layer having said first type of stress, said first and second sub-layer forming said first contact layer.

17. The method of claim 14, further comprising removing said one or more spacer elements from said second transistor prior to forming said second metal silicide.

18. A semiconductor device, comprising:

a first transistor having a first gate electrode and first drain and source regions and a first conformal liner formed at sidewalls of said first gate electrode and on a portion of said first drain and source regions, said first gate electrode and said first drain and source regions having formed therein first metal silicide regions;

a second transistor having a second gate electrode and second drain and source regions and a second conformal liner formed at sidewalls of said second gate electrode and on a portion of said second drain and source regions, said second gate electrode and said second drain and source regions having formed therein second metal silicide regions;

a first contact layer formed above said first metal silicide regions and having a first type of stress;

a second contact layer formed above said second metal silicide regions and having a second type of stress other than said first type; and an interlayer dielectric layer formed on said first and second contact layers.

19. The semiconductor device of claim 18, wherein said first contact layer is formed on said first metal silicide regions and said second contact layer is formed on said second metal silicide regions.

20. The semiconductor device of claim 18, further comprising a spacer element formed on said first liner adjacent to sidewalls of said first gate electrode.

21. The semiconductor device of claim 18, wherein at least one of said first and second drain and source regions comprises a crystalline strain layer for inducing strain in a respective channel region of at least one of said first and second transistors.

* * * * *